(12) United States Patent
Takai

(10) Patent No.: US 7,180,361 B2
(45) Date of Patent: Feb. 20, 2007

(54) ANTIFUSE PROGRAMMING CIRCUIT IN WHICH ONE STAGE OF TRANSISTOR IS INTERPOSED IN A SERIES WITH ANTIFUSE BETWEEN POWER SUPPLIES DURING PROGRAMMING

(75) Inventor: Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 140 days.

(21) Appl. No.: 10/958,358

(22) Filed: Oct. 6, 2004

(65) Prior Publication Data
US 2005/0083717 A1 Apr. 21, 2005

(30) Foreign Application Priority Data
Oct. 7, 2003 (JP) ............................. 2003-348311

(51) Int. Cl.
*H01H 37/76* (2006.01)
(52) U.S. Cl. ....................................... 327/525; 327/526
(58) Field of Classification Search ............... 327/525, 327/526; 365/96, 225.7
See application file for complete search history.

(56) References Cited

U.S. PATENT DOCUMENTS 6,163,488 A * 12/2000 Tanizaki et al. ......... 365/225.7
6,194,738 B1 * 2/2001 Debenham et al. ...... 365/225.7
6,333,667 B2 12/2001 Lee
6,400,632 B1 * 6/2002 Tanizaki et al. ......... 365/225.7

FOREIGN PATENT DOCUMENTS

JP 2001-243787 A 9/2001

OTHER PUBLICATIONS

Kyeong-Sik Min et al., A Post-Package Bit-Repair Scheme Using Static Latches with Bipolar-Voltage Programmable Antifuse Circuit for High-Density DRAMs, 2001 Symposium on VLSI Circuits Digest of Tech. Papers, pp. 67-68.
Joo-Sun Choi et al., "Antifuse EPROM Circuit for Field Programmable DRAM," 2000 IEEE International Solid-State Circuits Conference, pp. 406-407.

* cited by examiner

*Primary Examiner*—Long Nguyen
(74) *Attorney, Agent, or Firm*—Foley & Lardner LLP

(57) ABSTRACT

The antifuse programming circuit of the present invention includes a plurality of antifuses, a first transistor for selecting an antifuse for programming from among the plurality of antifuses, and a second transistor. A selection signal for selecting an antifuse is applied to the gate of the first transistor, and a first power supply is connected to the source of the first transistor. In addition, a second power supply is connected to the drain of the second transistor, and the drain of the first transistor is connected to the source of the second transistor. Finally, a programming voltage is applied to one terminal of the antifuse, and the drain of the first transistor is connected to the other terminal of the antifuse.

17 Claims, 3 Drawing Sheets

ANTIFUSE PROGRAMMING CIRCUIT IN WHICH ONE STAGE OF TRANSISTOR IS INTERPOSED IN A SERIES WITH ANTIFUSE BETWEEN POWER SUPPLIES DURING PROGRAMMING

BACKGROUND OF THE INVENTION

1. Field of the Invention

The present invention relates to an antifuse programming circuit of a semiconductor memory device.

2. Description of the Related Art

In semiconductor memory devices, a method for improving yield is conventionally employed in which memory cells that are defective due to faults are replaced by spare memory cells.

As one example of this type of method, a technique has been proposed in which high voltage is applied from the outside to program (destroy) antifuses, as shown in FIG. 1 (for example, refer to 2000 IEEE International Solid-State Circuits Conference, ISSCC 2000/Session 24/DRAM/Paper WP 24.8, pp. 406–407). Alternatively, as shown in FIG. 2, methods have been proposed in which the applied voltage is a negative voltage that is generated inside (for example, refer to 2001 Symposium on VLSI Circuits, Digest of Technical Papers, "A Post-Package Bit-Repair Scheme Using Static Latches with Bipolar-Voltage Programmable Antifuse Circuits for High-Density DRAMs," pp. 67–68).

In FIG. 1, during programming, node VPRG is at a high voltage VPP that is equal to or greater than VDD, and selection signal SEL is applied to the gate of transistor M21. At this time, node Lo of antifuse AF that has been selected by transistor M21 is at VSS, and antifuse AF is thus programmed. Node N3 of antifuse that is not selected is VDD because transistor M21 is OFF. At levels equal to or greater than VDD–VTN, NMOS M26 turns OFF and programming therefore does not occur. In addition, in antifuse AF that is programmed and conductive at both ends, NMOS M26 remains OFF even when node Lo is at level VPP, and a leakage current therefore does not flow. Essentially, PMOS M25 has the functions of charging the Lo node of an undestroyed antifuse to VPP–VTN and relaxing the voltage differential at the two ends of the antifuse, and NMOS M26 has a blocking function such that leakage current does not flow by way of an already destroyed antifuse.

FIG. 2 corresponds to a case in which the polarity in FIG. 1 is reversed.

In Japanese Patent Laid-Open Publication No. 2001-243787 (Page 1, FIG. 1), a technique is disclosed in which, in a programming circuit in which a negative voltage is applied, the output terminal of a negative voltage generation means is connected to the ground terminal.

In order to program an antifuse, it is necessary to apply high voltage and cause current to flow. In the above-described prior art, two stages of transistors are interposed in a series with the antifuse between the two terminals of the power supply when programming (NMOS M21 and NMOS M26 in FIG. 1, and NMOS M33 and MNOS M38 in FIG. 2). Thus, if a drop in voltage is to be suppressed and the current capacity secured, the area that is occupied by the transistors becomes great.

In the prior-art example that is shown in FIG. 1, eliminating NMOS M26 to leave just one transistor means that when node Lo (N3) becomes VPRG, PMOS M25 that is connected to VDD will not turn OFF and a leakage current will flow between VPRG-VDD. As a result, with the progression of programming of the multiplicity of antifuses that exist on a chip, the voltage of VPP (VPRG) will drop and the applied voltage and current will therefore also drop, preventing the stable programming of antifuses.

SUMMARY OF THE INVENTION

It is an object of the present invention to provide an antifuse programming circuit that provides a solution to the flaws of the above-described prior art by both allowing stable antifuse programming and reducing the number of circuit elements.

To achieve the above-described objects, the present invention adopts the following configuration. The antifuse programming circuit of the present invention includes: a plurality of antifuses, a first transistor for selecting an antifuse that is to be programmed from among the plurality of antifuses, and a second transistor. A selection signal for selecting an antifuse is applied to the gate of the first transistor, and a first power supply is connected to the source of the first transistor. A second power supply is connected to the drain of the second transistor, and the drain of the first transistor is connected to the source of the second transistor. A programming voltage is applied to one terminal of the antifuse, and the drain of the first transistor is connected to the other terminal of the antifuse.

As described in the foregoing explanation, the present invention provides a single transistor that is interposed in a series with an antifuse between power supplies when programming and thus enables a suppression of the area occupied by transistors and a more effective utilization of limited space.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 3:
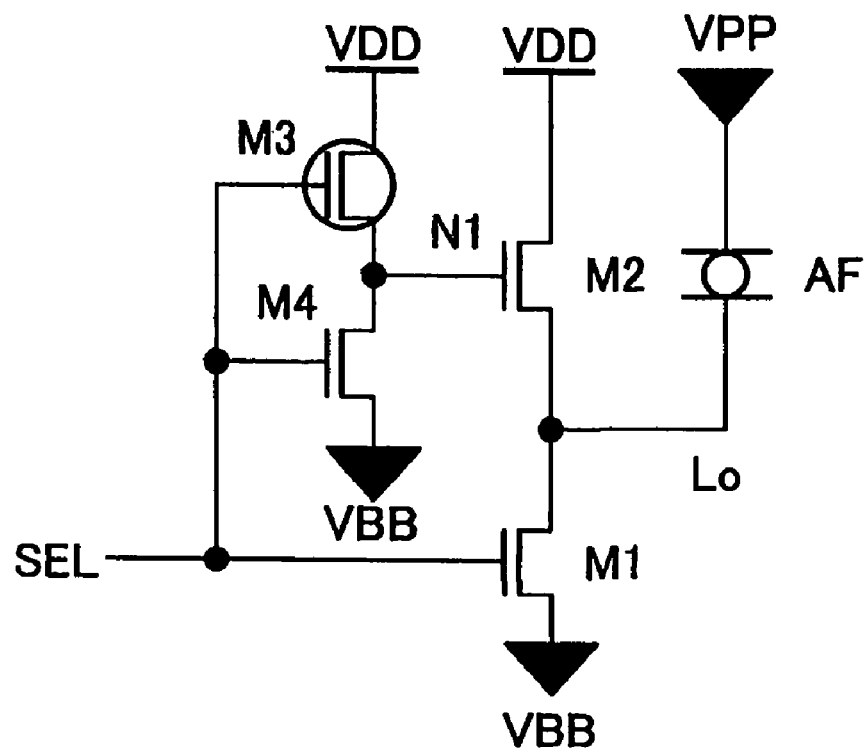
FIG. 3 is a circuit diagram showing the first embodiment of an antifuse programming circuit of the present invention.

As shown in FIG. 3, the first embodiment of the antifuse programming circuit of the present invention includes a plurality of antifuses, a first transistor M1 for selecting antifuse AF that is to be programmed from among the plurality of antifuses, and second transistor M2. Selection signal SEL for selecting antifuse AF is applied to the gate of first transistor M1, and first power supply VBB is connected to the source of first transistor M1. Second power supply VDD is connected to the drain of second transistor M2, and the drain of first transistor M1 is connected to the source of second transistor M2. Programming voltage VPP is applied to one terminal of antifuse AF, and the drain of first transistor M1 is connected to the other terminal of antifuse AF.

Figure 5:
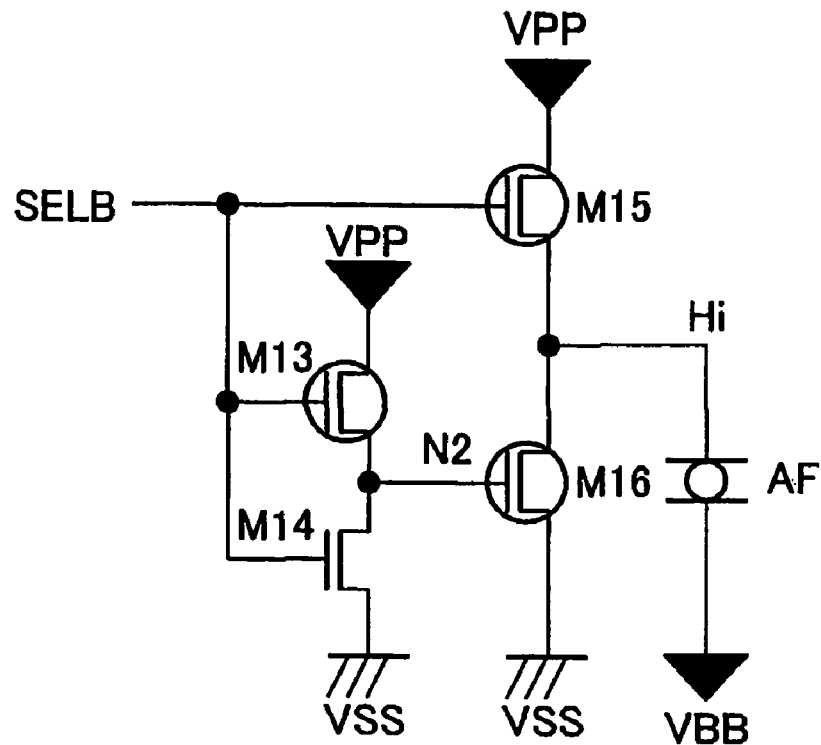
FIG. 5 is a circuit diagram showing the second embodiment of an antifuse programming circuit of the present invention.

As shown in FIG. 5, the second embodiment of the antifuse programming circuit of the present invention includes: a plurality of antifuses, first transistor M15 for selecting antifuse AF that is to be programmed from among the plurality of antifuses, and second transistor M16. Selection signal SELB for selecting antifuse AF is applied to the gate of first transistor M15, and first programming voltage VPP is applied to the source of first transistor M15. First power supply VSS is connected to the drain of second transistor M16, and the drain of the first transistor M15 is connected to the source of second transistor M16. Second programming power supply (VBB) is connected to one of the terminals of antifuse AF, and the drain of first transistor M15 is connected to the other terminal of antifuse AF.

First Embodiment

FIG. 3 is a circuit diagram showing the first embodiment of the antifuse programming circuit of the present invention.

In FIG. 3, AF is an antifuse in which a programming voltage VPP that is a higher voltage than VDD is applied to one terminal. M1 is an NMOS transistor in which selection signal SEL for selecting antifuse AF is applied to the gate. The other terminal of antifuse AF is connected to the drain of M1, and power supply VBB (having a voltage that is lower than the ground voltage) is connected to the source of M1. M2 is an NMOS transistor in which power supply voltage VDD that is lower than the programming voltage VPP is applied to the drain, and the drain of transistor M1 is connected to the source. M3 and M4 are transistors that form inverters. Selection signal SEL is applied to the inputs of these inverters, and the output node N1 of these inverters is connected to the gate of transistor M2.

When programming a selected antifuse AF in the antifuse programming circuit of this configuration, a voltage of the VDD level is applied as selection signal SEL to the gate of transistor M1, whereby transistor M1 turns ON. As a result, voltage VBB that is lower than the ground voltage is applied to one end of antifuse AF. Voltage VPP is applied to the other end of selected antifuse AF, and antifuse AF is thus programmed.

On the other hand, when antifuse AF is not selected, a voltage of VBB (L level) is applied as the non-selection signal SEL to the gate of transistor M1, and transistor M1 therefore turns OFF. In addition, H level is supplied as output at output node N1 of inverters M3 and M4. Accordingly, VDD is applied to node Lo, which is one end of antifuse AF, and antifuse AF is therefore not programmed even if a high-voltage programming voltage VPP is applied to the other end of antifuse AF.

If VBB-level non-selection signal SEL is applied to the gate of transistor M1 after antifuse AF has been programmed, transistor M1 turns OFF, and further, H-level voltage is supplied as output at node N1 by way of inverters M3 and M4. Nevertheless, high-voltage programming voltage VPP is applied to node Lo, whereby transistor M2 turns OFF and a leakage current does not flow through transistor M2. Accordingly, no decrease occurs in programming voltage VPP.

Figure 1:
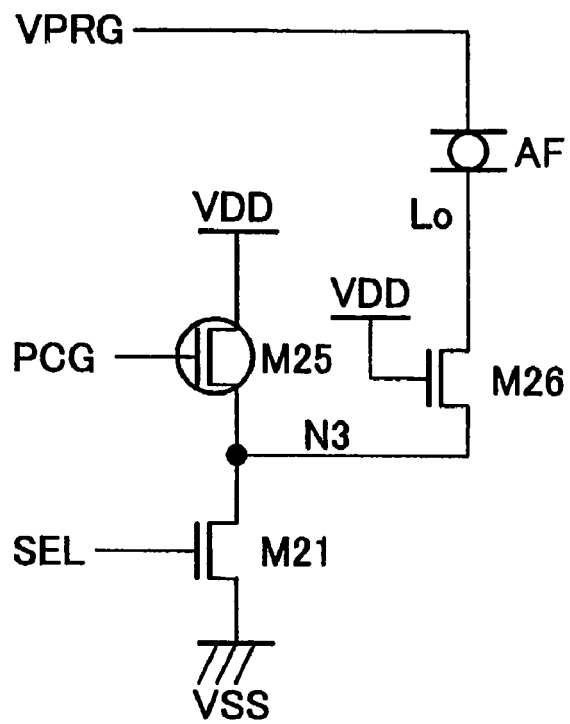
FIG. 1 is a circuit diagram showing the first example of the prior art of an antifuse programming circuit.
Figure 2:
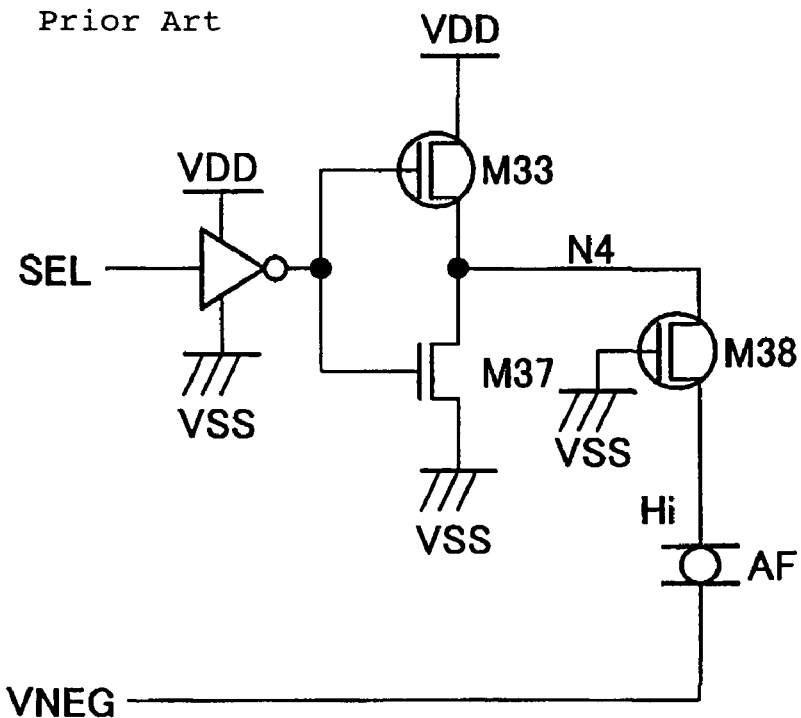
FIG. 2 is a circuit diagram showing the second example of the prior art of an antifuse programming circuit.

NMOS M2 is thus capable of performing the functions served by both PMOS M25, which is to charge node Lo of the undestroyed antifuse to VDD−VTN and relax the voltage differential at the two ends of the antifuse, and NMOS M26, which is to block the flow of leakage current through the destroyed antifuse, in FIG. 1 of the prior-art example.

The present invention therefore enables the deletion of transistor M26, which was necessary in the prior art, and reduce the number of transistors that are connected in series to the antifuse to just one.

In addition, although NMOS M1 required a large capacity for programming the antifuse, the capacity of NMOS M2 need only be sufficient for holding voltage, and therefore may have small capacity and occupy little area.

Information regarding destruction/non-destruction of antifuses during normal operation is held in latch circuits that are provided for each antifuse for stable operation. For example, when the power supply is introduced: signal SEL is set to high voltage and transistor M1 turns ON; and voltage VDD is applied to the VPP node and 0 V is applied to the VBB node, whereby node Lo is precharged. When signal SEL is subsequently made low voltage, transistor M1 turns OFF, and transistor M2 turns ON: node Lo of a non-destroyed antifuse is charged to VDD−VTN, and node Lo of a destroyed antifuse is charged to VDD; whereby the level of node Lo is amplified and detected by, for example, a differential amplifier and held in a latch. If a logic circuit is further added such that node N1 also becomes low voltage when SEL is set to low voltage, the level of node Lo of a non-destroyed antifuse will remain at 0V and the margin of the differential ampflier can therefore be expanded.

Figure 4:
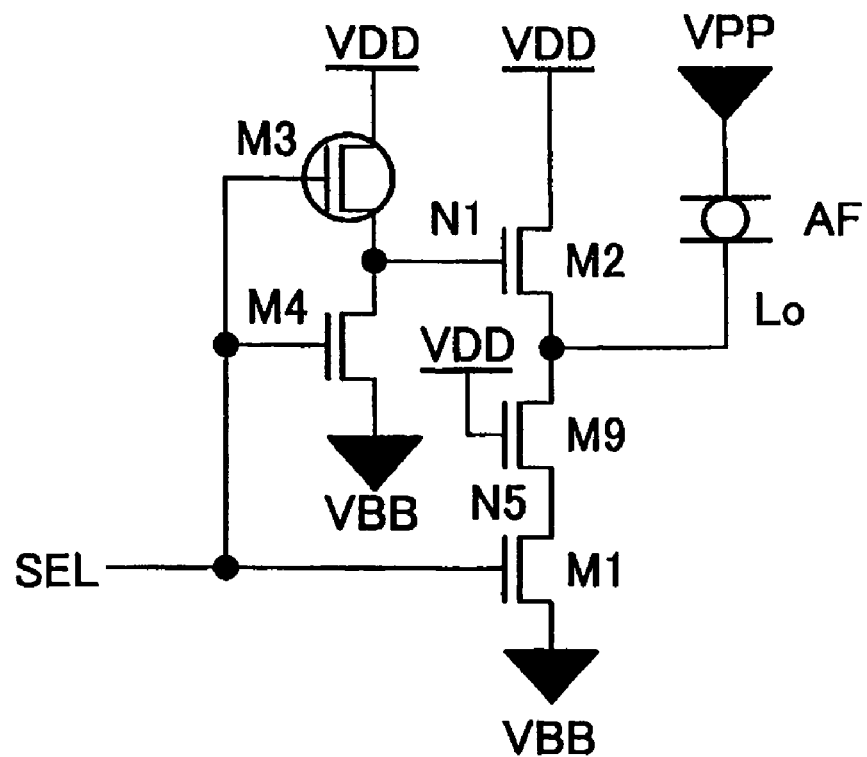
FIG. 4 is a circuit diagram showing a modification of the first embodiment of an antifuse programming circuit of the present invention.

FIG. 4 shows a circuit in which transistor M9 having its gate connected to VDD is connected between the source of transistor M2 and the drain of transistor M1 for cases in which the source-drain breakdown voltage of transistor M1 of FIG. 3 is insufficient.

Second Embodiment

FIG. 5 is a circuit diagram showing the second embodiment of the antifuse programming circuit of the present invention.

In FIG. 5, AF is an antifuse having one end connected to voltage VBB (a voltage lower than the ground voltage). M15 is a PMOS transistor in which selection signal SELB for selecting antifuse AF is applied to the gate. A high-voltage programming voltage VPP is connected to the source of M15, and the other end of antifuse AF is connected to the drain of M15. M16 is a PMOS transistor in which power supply VSS (0 V) is applied to the drain, and both the drain of transistor M15 and the other end of antifuse AF are connected to the source. M13 and M14 are transistors that form inverters. Selection signal SELB is applied to the inputs of these inverters, and output node N2 of these inverters is connected to the gate of transistor M16.

When programming a selected antifuse AF in this type of antifuse programming circuit, a voltage of VSS (0 V) is applied as selection signal SELB to the gate of transistor M15, whereupon transistor M15 turns ON and voltage VPP is applied to the Hi end of selected antifuse AF. Voltage VBB of lower voltage than the ground voltage is applied to the other end of antifuse AF, whereby antifuse AF is programmed.

On the other hand, when antifuse AF is not selected, a high voltage of VPP level is applied as non-selection signal SELB to the gate of transistor M15, whereby transistor M15 turns OFF. In addition, node N2 becomes L level, whereby transistor M16 turns ON. Node Hi of antifuse AF is connected to VSS and non-selected antifuse is not programmed. Further, at this time, node Hi is OFF because, at levels that are equal to or less than |VTP|, the voltage across the gate and source of PMOS M16 is equal to or greater than −VTP.

After antifuse AF has been programmed, operation continues as above even when a non-selection signal SEL of VPP level is applied to the gate of transistor M15, and leakage current does not flow in transistor M15. Accordingly, there is no occurrence of a decline in programming voltage VPP.

Figure 6:
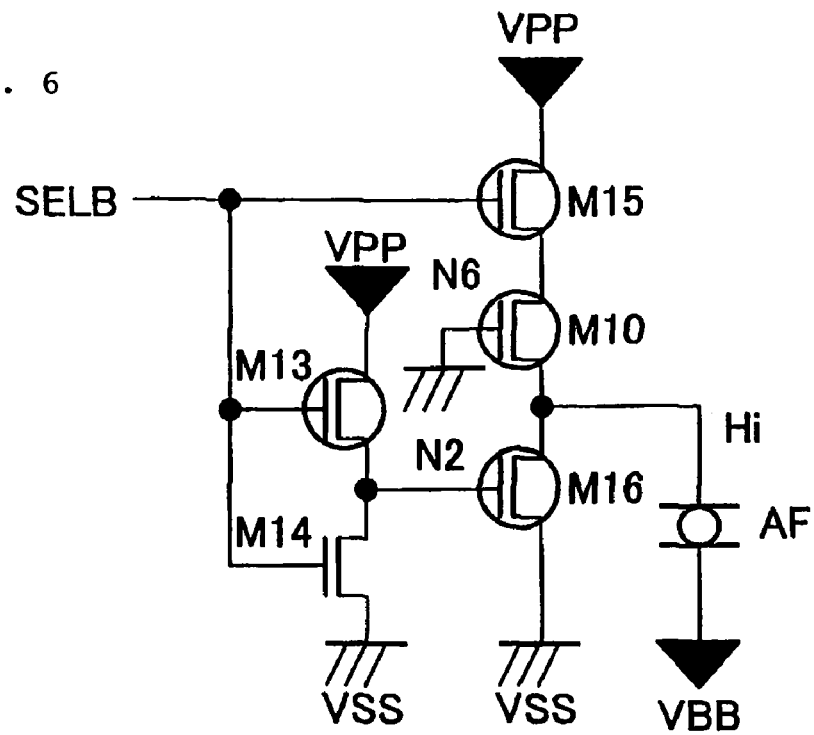
FIG. 6 is a circuit diagram showing a modification of the second embodiment of an antifuse programming circuit of the present invention.

FIG. 6 shows a circuit in which transistor M10 having its gate connected to 0V is connected between the drain of transistor M15 and the source of transistor M16 for cases in which the breakdown voltage across the source and drain of transistor M15 of FIG. 5 is insufficient.

Although the terminal of antifuse AF is connected to power supply VBB in FIGS. 5 and 6, this terminal may also be connected to VSS.

While preferred embodiments of the present invention have been described using specific terms, such description is for illustrative purposes only, and it is to be understood that changes and variations may be made without departing from the spirit or scope of the following claims.

What is claimed is:

1. An antifuse programming circuit, comprising:
   an antifuse having a first terminal and a second terminal, the first terminal of the anitfuse connected to receive a programming voltage;
   a first transistor having a drain and a source and a gate, the drain of the first transistor connected to the second terminal of the antifuse, the source of the first transistor connected to a first power supply, the gate of the first transistor connected to receive a selection signal, the selection signal able to be set to a selection level to indicate that said anitfuse is to be programmed; and
   a second transistor having a drain and a source and a gate, the drain of the second transistor connected to a second power supply, the source of the second transistor connected to the drain of the first transistor;
   wherein the second power supply is configured to supply a voltage to the drain of the second transistor that is lower than the programming voltage.

2. The antifuse programming circuit according to claim 1, wherein, when said selection signal is set to a non-selection level and said antifuse is in a programmed state, said first transistor and said second transistor both turn OFF.

3. The antifuse programming circuit according to claim 1, wherein the drain and gate of said second transistor are at a same voltage when said first transistor is OFF.

4. The antifuse programming circuit according to claim 1, wherein said selection signal is inverted and applied as an input to the gate of said second transistor.

5. The antifuse programming circuit according to claim 1, wherein said first transistor and said second transistor are of a same conductive type.

6. The antifuse programming circuit according to claim 1, wherein the first power supply is configured to supply a specific voltage to the source of the first transistor that is lower than a ground voltage.

7. The antifuse programming circuit according to claim 1, wherein the programming voltage is higher than a ground voltage.

8. The antifuse programming circuit according to claim 1, wherein the second terminal of the antifuse is not connected to a capacitor.

9. An antifuse programming circuit, comprising: antifuse having a first terminal and a second terminal, the first terminal of the antifuse connected to a first programming power supply;
   a first transistor having a drain and a source and a gate, the drain of said first transistor connected to the second terminal of the antifuse, the source of said first transistor connected to a second programming power supply, the gate of said first transistor connected to receive a selection signal, the selection signal able to be set to a selection level to indicate that said anitfuse is to be programmed; and
   a second transistor having a drain and a source and a gate, the drain of said second transistor connected to a specific power supply, the source of said second transistor connected to the drain of said first transistor;
   wherein the first programming power supply is configured to supply a voltage to the first terminal of the antifuse that is lower than a ground voltage.

10. The antifuse programming circuit according to claim 9, wherein, when said selection signal is set to a non-selection level, said first transistor turns OFF.

11. The antifuse programming circuit according to claim 9, wherein the drain and gate of said second transistor are at a same voltage when said first transistor is OFF.

12. The antifuse programming circuit according to claim 9, wherein said selection signal is inverted and applied as an input to the gate of said second transistor.

13. The antifuse programming circuit according to claim 9, wherein said first transistor and said second transistor are of a same conductive type.

14. The antifuse programming circuit according to claim 9, wherein the second programming power supply is configured to supply a particular voltage to the source of the first transistor;
   wherein the specific power supply is configured to supply a specific voltage to the drain of the second transistor; and
   wherein the particular voltage is higher than the specific voltage.

15. The antifuse programming circuit according to claim 9, wherein the specific power supply is configured to supply a specific voltage to the drain of the second transistor that is higher than the ground voltage.

16. The antifuse programming circuit according to claim 9, wherein the second terminal of the antifuse is not connected to a capacitor.

17. The antifuse programming circuit according to claim 9, wherein the first transistor and the second transistor are PMOS transistors.

* * * * *